United States Patent [19]

Mathes et al.

[11] Patent Number: 4,682,150

[45] Date of Patent: Jul. 21, 1987

[54] DATA COMPRESSION METHOD AND APPARATUS

[75] Inventors: Gene R. Mathes, Zanesville; Robert L. Protheroe, Cambridge, both of Ohio

[73] Assignee: NCR Corporation, Dayton, Ohio

[21] Appl. No.: 806,309

[22] Filed: Dec. 9, 1985

[51] Int. Cl.[4] .................................... H03M 7/30

[52] U.S. Cl. .................................... 340/347 DD; 364/200; 364/900

[58] Field of Search .................... 340/347 DD; 235/310, 235/311; 364/200, 900

[56] References Cited

U.S. PATENT DOCUMENTS

| | | | |
|---|---|---|---|
| 3,694,813 | 9/1972 | Loh et al. | 340/172.5 |
| 3,717,851 | 2/1973 | Cocke et al. | 340/172.5 |
| 3,925,780 | 12/1975 | Van Voorhis | 340/347 DD |
| 4,021,782 | 5/1977 | Hoerning | 340/172.5 |
| 4,031,515 | 6/1977 | Kashio | 364/200 |
| 4,034,350 | 7/1977 | Kashio | 364/900 |
| 4,232,375 | 11/1980 | Paugstat | 364/900 |

*Primary Examiner*—Charles D. Miller

*Attorney, Agent, or Firm*—Wilbert Hawk, Jr.; Albert L. Sessler, Jr.; Richard W. Lavin

[57] ABSTRACT

A system and apparatus for compressing redundant and non-redundant binary data generated as part of an operation of a time and attendance terminal in which the data represents the time an employee is present during working hours. The first data entry includes the date and the time the employee operates the terminal together with other data identifying the employee which is stored in a circular buffer. The time of day data includes the hour and the minutes of the keyboard operation. Subsequent data entries include redundant data such as the date and the hour of the terminal operation which may not change and non-redundant data such as the minutes that pertain to the terminal operation together with data identifying the operator. After the redundant and non-redundant data of the first data entry are stored, only the non-redundant data of each subsequent data entry is stored. Upon reading out the non-redundant data from the buffer, a pointer which includes the redundant data such as the date and the hour of the first data entry is added to the non-redundant data read. If the date and/or hour changes, such changed data is stored in the buffer and is transferred to the pointer as the data is read out of the buffer, thus updating the data stored in the pointer.

5 Claims, 13 Drawing Figures

DATA COMPRESSION METHOD AND APPARATUS

BACKGROUND OF THE INVENTION

The present invention relates generally to data compression systems and more particularly to a method and apparatus for reducing the number of data bits to be stored in a block of data generated during the operation of a terminal device without losing the informational content of the data, in which the time of day is part of the data. In modern on-line data processing systems in which data is generated by remote data processing devices, cost is always a factor in the purchase of the system. One of the areas of cost is the amount of memory associated with the terminal device. In order to fully utilize the memory capacity found in today's terminal devices, various methods for compacting the data when stored in the memory has been devised. For example, in U.S. Pat. No. 4,021,782, the data is compacted by varying the length and number base of the data. In U.S. Pat. Nos. 3,694,813, 3,717,851 and 3,925,780, data processing techniques using variable length codes to encode data in order to reduce the amount of data that is to be stored are disclosed. Since all of these techniques are directed for use with a central processing unit, their use by a stand-alone data terminal device which generates data independently of the processing unit would not be econcmically feasible.

It is therefore a primary object of this invention to provide a low-cost data compression apparatus capable of reducing the amount of data that is to be stored in a memory unit and which has been generated as a result of a data terminal operation without losing any of the data transactional detail, the reduced data being used to restore the original data when the data is transferred to a central processing unit.

SUMMARY OF THE INVENTION

These and other objects of this invention are fulfilled by providing in a terminal device a circular buffer in which is stored data, such as data pertaining to the time an employee checks in and checks out, thereby providing a work record. The terminal includes a time of day circuit which continuously outputs time data including the date, the hour and minute. In storing the data, the first data entry will include redundant data such as the date and hour and non-redundant data such as the minutes of the terminal operation. The term "redundant", as used in this description of the invention, refers to data which is the same on each data entry, while "non-redundant" refers to data which varies between data entries. Subsequent data entries will result in the storing in the buffer of only the non-redundant data such as the minutes that pertain to the check in or transaction, together with data identifying the employee. In transferring the stored data from the circular buffer to a central processing unit, the date/hour redundant data that has not changed between entries is stored in a pointer which is used to read out the non-redundant data stored in the circular buffer. As part of the read-out operation, the pointer will add such redundant date/hour data together with a sequence number to the non-redundant data being read out of the buffer. As the hour changes, such change is stored at the appropriate location in the buffer. When reading out the changed data, the changed data is transferred for storage in the pointer which will then add such changed data to the data subsequently read out of the buffer by the pointer.

BRIEF DESCRIPTION OF THE DRAWING

Various objects, features and advantages of the invention, as well as the invention itself, will become more apparent to those skilled in the art in light of the following detailed description, taken into consideration with the accompanying drawings, wherein like reference numerals indicate identical or corresponding parts throughout the several views and wherein.

DESCRIPTION OF THE PREFERRED EMBODIMENT

Figure 1:
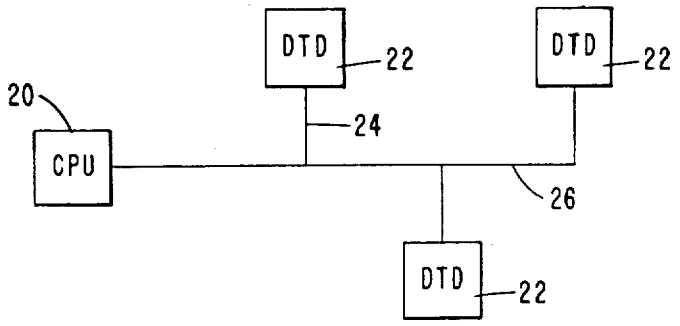
FIG. 1 is a block diagram of the data processing system in which the terminal of the present invention is located.

Referring now to FIG. 1, there is shown a block diagram of a data processing system which includes a central processing unit (CPU) 20 and a plurality of remote data terminal devices (DTD) 22 each of which is connected by a bus 24 to a data transmission channel 26 over which data is exchanged between the CPU 20 and the terminal devices 22. In the present embodiment, one of the terminal devices 22 comprises a time and attendance terminal which is used for entering, storing, and transmitting clocking transactions associated with employee work periods, providing accurate time records of such transactions and also recalling previous transactions.

Figure 2:
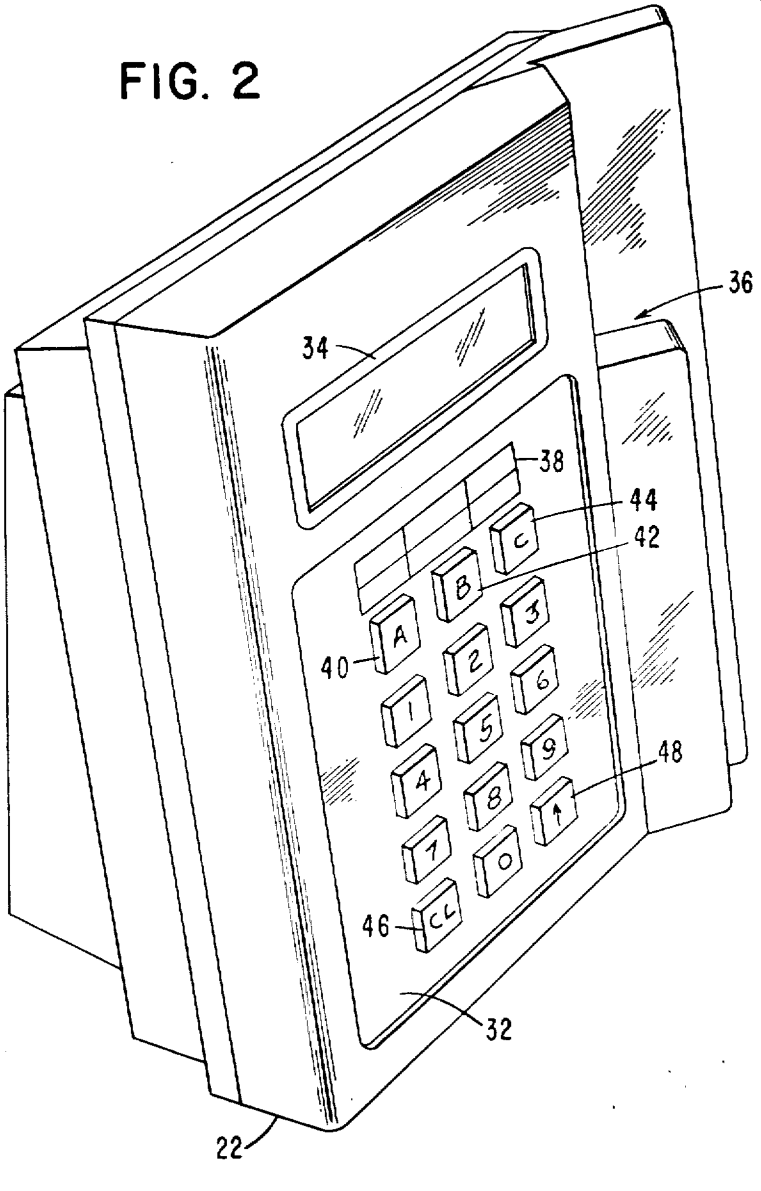
FIG. 2 is a perspective view of the time and attendance terminal in which the present invention is found.

Referring now to FIG. 2 there is shown a perspective view of the time and attendance terminal device 22 in which the present invention is found. The terminal 22 is normally secured to a wall partition by any conventional mounting means and includes a 15 key keyboard 32, a two-line by 16-character back-lighted LCD display 34 and a slot portion generally indicated by the numeral 36 into which a magnetic stripe record card (not shown) is inserted and moved by the employee to be read by a magnetic card reader 30 (FIG. 4) located within the terminal device 22 for entering the employee I.D. number into the device.

Figure 3:
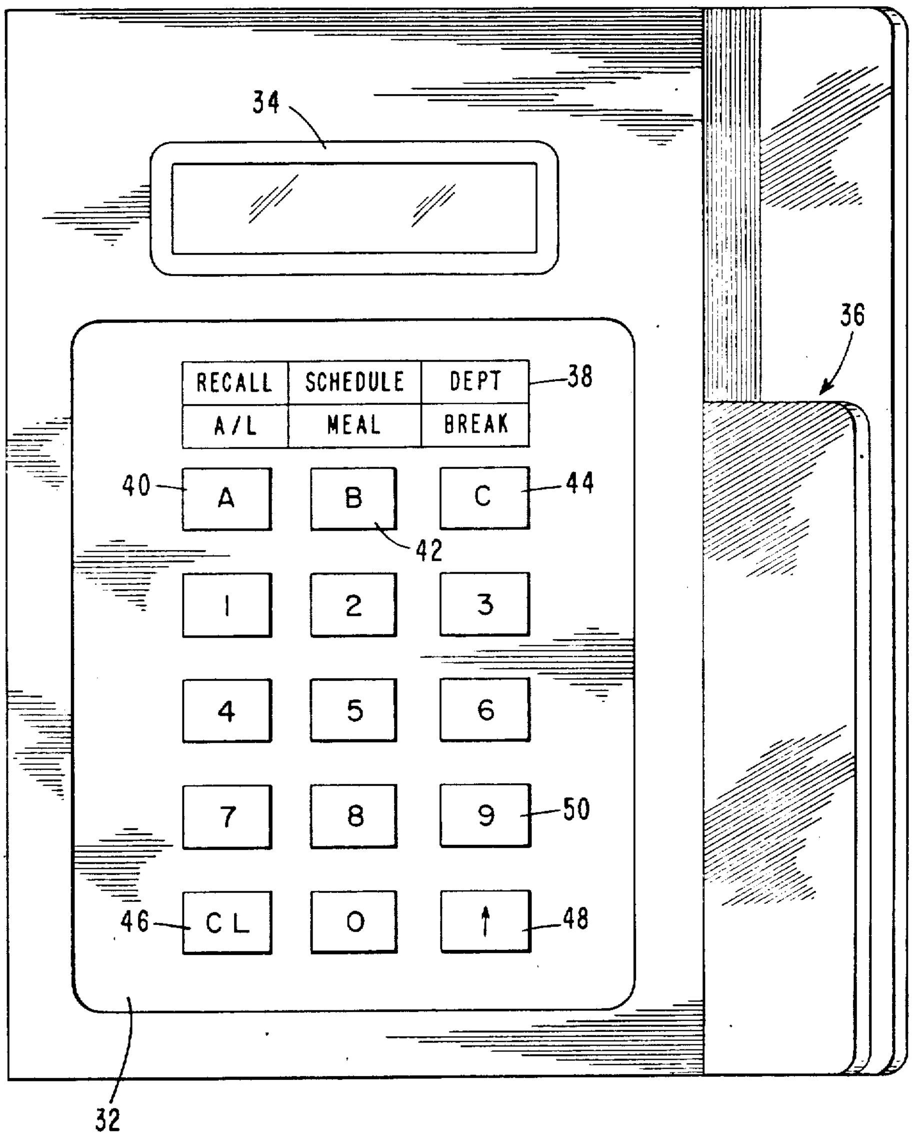
FIG. 3 is a plan view of the keyboard of the time and attendance terminal of the present invention.

As shown more clearly in FIG. 3, the keyboard 32 includes function and transaction keys 40, 42 and 44, a clear key 46, a shift key 48 and the numerical keys 50 of a ten-key portion of the keyboard. There is further included in the keyboard a logo portion 38 which contains data identifying the function of the keys 40, 42 and 44. As indicated in the logo portion 38, the keys 40–44 inclusive represent the functions A (Arrive)/L(Leave), Meal and Break, respectively. Upon depressing the shift key 48, the keys 40–44 inclusive functionally represent Recall, Schedule and Department respectively.

Figure 4:
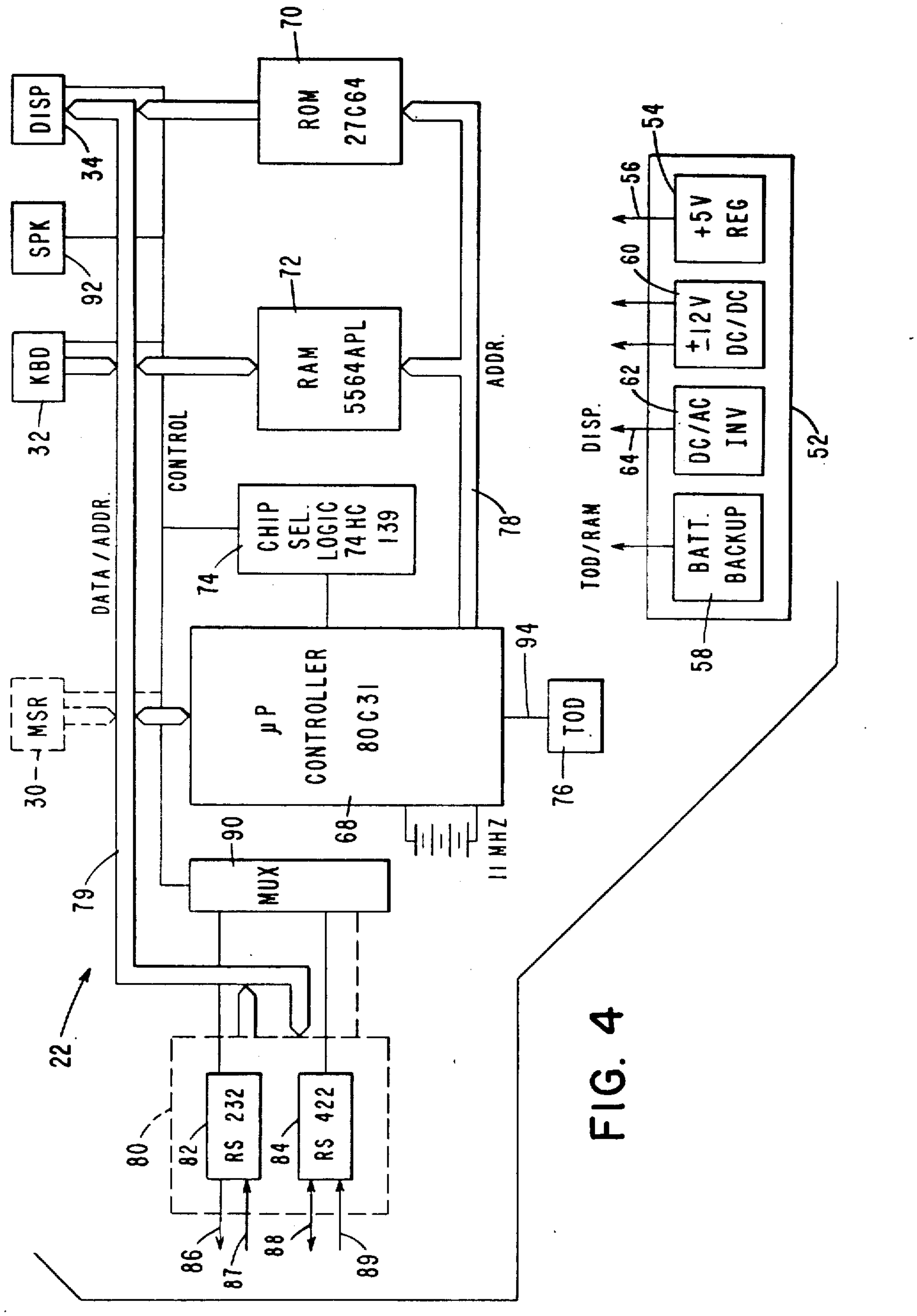
FIG. 4 is a block diagram of the time and attendance terminal.

Referring now to FIG. 4, there is shown a block diagram of the time and attendance terminal device 22. Included in the terminal device is a power supply section 52 comprising a five-volt voltage regulator 54 for outputting five volts potential over line 56, a memory battery back-up voltage supply 58 for supplying voltage to a RAM memory unit 72 and a time of day (TOD) circuit 76 in case of a power failure, a plus or minus 12 volt DC-DC voltage supply 60 and a DC to AC inverter 62 which outputs 90 volts AC over line 64 to operate the illumination of the display 34.

The terminal device 22 further includes an INTEL 80C31 microcontroller 68, an INTEL 27C64 ROM program memory 70, a Toshiba 5564 APL RAM data memory 72, a Texas Instruments 74 HC 139 chip select circuit 74 and a Signetics PCB 8573 time of day (TOD) circuit 76. The circuits are interconnected by the busses 78 and 79 in a manner that is well known in the art. The INTEL circuits are commercially available from the INTEL Corporation of Santa Clara, Calif., the Texas Instruments circuit is commercially available from the Texas Instruments Inc. of Dallas, Texas, the Toshiba memory is commercially available from the Toshiba Corporation of Tustin, Calif. and the Signetics circuit is commercially available from the Signetics Corporation of Sunnyvale, Calif.

The terminal device further includes a communication section 80 which includes a RS-232 line driver and receiver 82 and a RS-422 line driver and receiver 84 for controlling the transfer of data over the transmission lines 86–89 inclusive between the CPU 20 (FIG. 1) and the time and attendance terminal device 22 in a manner that will be described more fully hereinafter. The time and attendance terminal device 22 also includes a multiplexor 90, the keyboard 32 (FIGS. 2 and 3), the magnetic stripe card reader 30, the display 34 (FIGS. 2 and 3) and a speaker 92. The time of day circuit 76 outputs over line 94 data bits representing the current time of day and hours and minutes to the microcontroller 68. The RAM data memory 72 and the time of day circuit 76 are connected to the battery back-up voltage supply 58 so that the data is retained and is current upon an interruption in the normal power supply circuit 60 and 62. The communication lines 86–88 inclusive are part of the bus 24 (FIG. 1).

As will be explained more fully hereinafter, an employee enters his/her employee number by means of the keys 50 of the keyboard 32 or by the use of the magnetic stripe card (not shown) in the manner that is well known in the art. As the employee number is entered into the terminal, the display 34 will display the number as it is entered. The employee then depresses one of the transaction keys 40–44 inclusive which identifies the type of transaction that is being entered. The time and attendance terminal device will perform a check digit verification of the employee number and the display 34 will display the employee number and a six-character mnemonic corresponding to the transaction key 40–44 inclusive which is depressed. The generated data including the time of day is then compressed and stored in the RAM memory unit 72. At various times throughout the day, the CPU 20 will request that the data stored in the memory unit 72 be transferred over bus 24 (FIG. 1) and the communication channel 26 to the CPU. As part of this operation, the compressed data is restored to its original form. Other operations of the terminal include a recall operation in which the previous terminal transactions associated with the employee are displayed on the display 34 (FIGS. 2 and 3) upon the actuation of the transaction key 40 (FIG. 2) used in conjunction with the operation of the shift key 48. Depressing the transaction key 42 and the shift key 48 will also display the work schedule of the employee which is obtained from the CPU 20. In case the employee's department number has to be changed, depression of the transaction key 44 will occur after the new department number has been entered into the device by the employee using the keys 50 of the keyboard.

Figure 5:
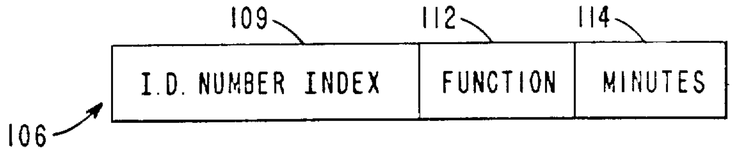
FIG. 5 is a block diagram illustrating the functional portions of a typical transaction record generated as a result of a terminal operation which is stored in the circular buffer.

Referring now to FIG. 5, there is illustrated an employee transaction record generally indicated by the numeral 106 and generated as a result of the operation of the keyboard 32 (FIGS. 1 and 2) by an employee. The transaction record is stored in a circular buffer 108 (FIG. 9) located within the RAM memory unit 72. The buffer 108 may comprise a circulating shift register. Included in the transaction record 106 is an 8-bit ID number index field 109 used by the microcontroller 68 in locating the employee I.D. number in a I.D. number table 110 (FIG. 8) stored in the RAM memory unit 72 (FIG. 4). Also included in the transaction record 106 is a two-bit function field 112 and a six-bit minutes field 114.

Another record stored in the circular buffer 108 (FIG. 9) as the result of a keyboard operation by the employee comprises a date/hour record generally indicated by the numeral 116 (FIG. 6) which includes a date/hour indicator flag 118, a date field 120 and a hour field 122. If the date has not changed during the operation of the terminal device, an hour record generally indicated by the numeral 124 (FIG. 7) is stored in the buffer 108 and includes an hour indicator flag 126 and an hour field 128.

Figure 8:
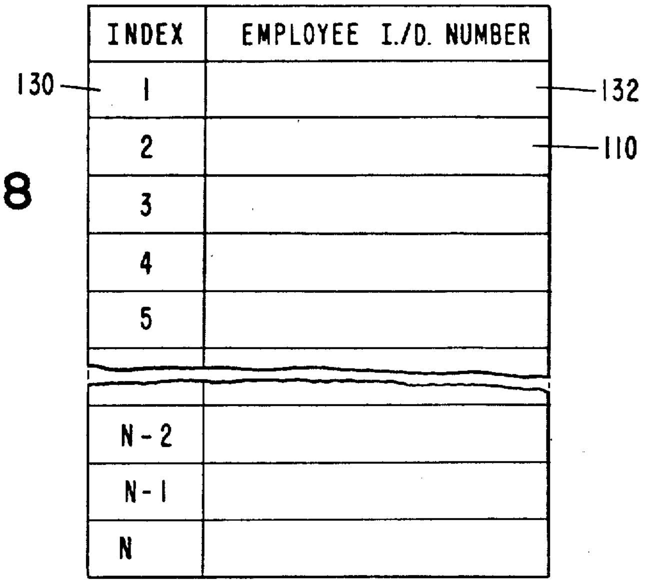
FIG. 8 shows the construction of the employee I.D. table located in the RAM memory unit of the time and attendance terminal.
Figure 9:
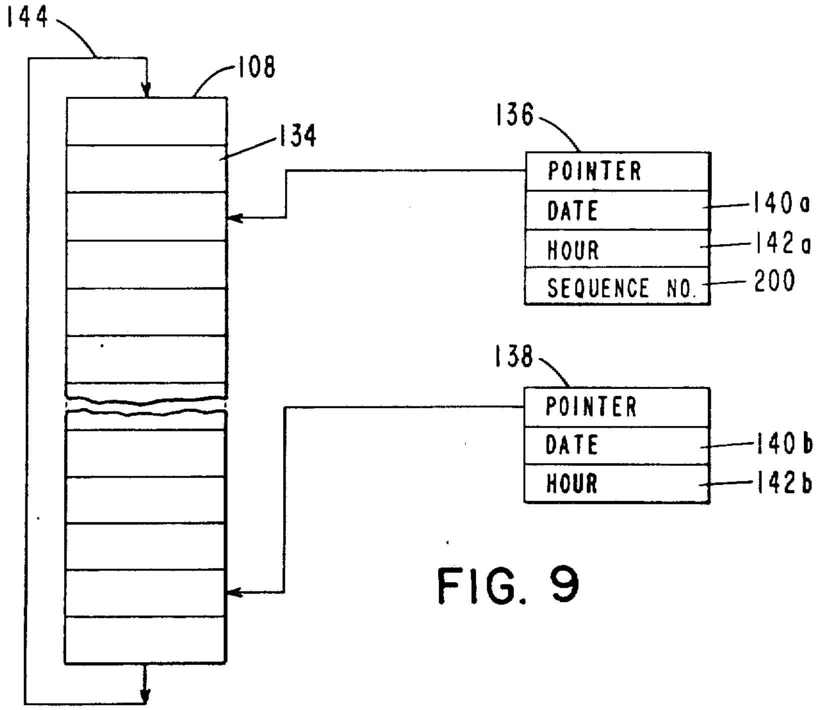
FIG. 9 shows the construction of the circular buffer located in the RAM memory unit of the terminal together with the data stored in the start and end of buffer pointers.

Referring now to FIG. 8, there is illustrated the employee I.D. number table 110 which includes an index portion 130 and a number portion 132 in which a 40 bit employee I.D. number is stored. Associated with the table 110 is the circular buffer 108 (FIG. 9) located in the RAM memory unit 72 (FIG. 4) which includes a plurality of storage locations 134, a start of buffer pointer 136 and an end of buffer pointer 138. Included in the pointers 136 and 138 are date 140 and hour 142 storage locations. The pointer 136 also includes a sequence number location 200 in which is located a counter for outputting a plurality of sequence numbers. The pointers 136 and 138 will circulate through each of the storage locations 134 following the path 144 in a manner that is well known in the art.

Figure 10A:
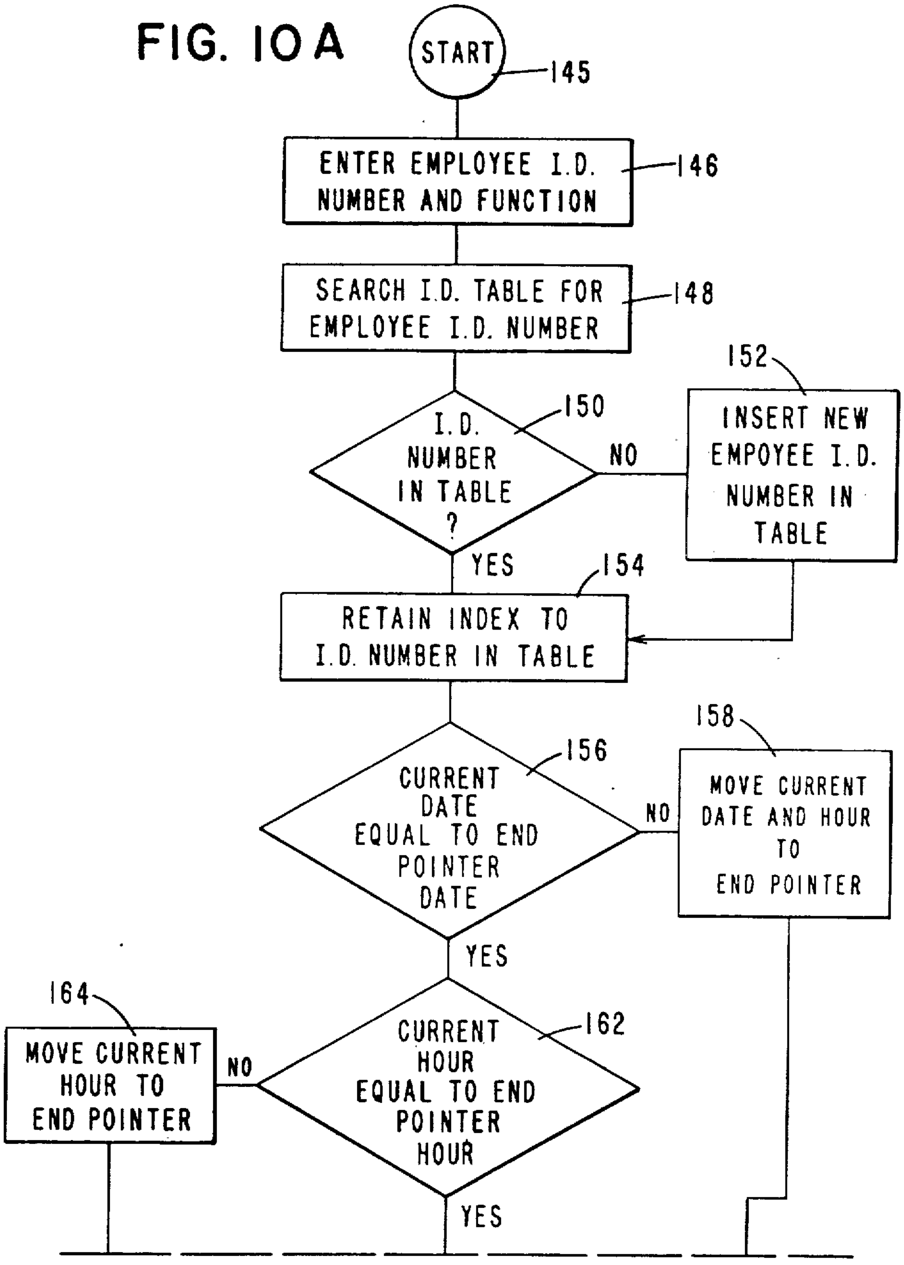
FIGS. 10A and 10B taken together form a schematic flow diagram illustrating the storing of transaction data in the circular buffer during which the data is compressed.
Figure 10B:
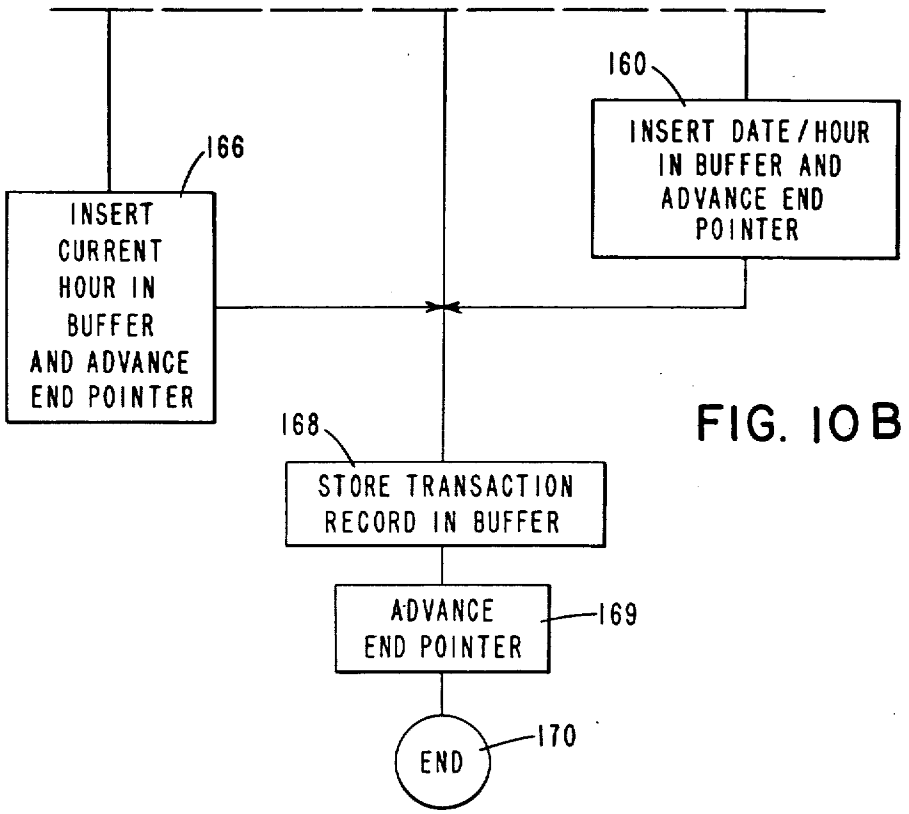

Referring now to FIGS. 10A and 10B, there is shown a flow diagram of the steps which occur in storing the transaction data in the buffer 108 as a result of an employee operating the keyboard 32 (FIGS. 1 and 2) in the manner described previously. At the start (block 145) of a terminal operation, an employee will enter his I.D.

number (block 146) by indexing the numerical keys 50 of the keyboard 32 (FIGS. 2 and 3) or by moving a magnetic striped card through the slot 36, and will then actuate one of the function or transaction keys 40–44 inclusive. The microcontroller 68 will then search the I.D. table 110 (FIG. 8) (block 148) for the employee I.D. number. If the number is not in the table (block 150), the microcontroller will insert the new I.D. number (block 152) and retain the index (block 154) to the location of the inserted I.D. number. If the number is found in the table 110, the index is retained (block 154) and the current date field 120 (FIG. 6) found in the storage location 140*b* (FIG. 9) located in the end of buffer pointer 138 is compared (block 156) with the current date being outputted by the time of day (TOD) circuit 76 (FIG. 4). If the date in the location 142*b* is not current, the new current date field 120 and hour field 122 (FIG. 6) are stored (block 158) in the storage locations 140*b*, 142*b* in the end of buffer pointer 138 (FIG. 9), the date/hour record 116 (FIG. 6) is stored in the storage location 134 in the buffer 108 pointed to by the end of buffer pointer 138, and the end of buffer pointer 138 is advanced (block 160) (FIG. 10B) to the next storage location 134 of the buffer 108.

If the date field 120 (FIG. 6) stored in the date location 140*b* (FIG. 9) of the pointer 138 is the same as the current date (block 156), the microcontroller 68 will compare the hour field 128 (FIG. 7) stored in the hour location 142*b* of the pointer 138 with the current hour (block 162). If the hours do not match, the microcontroller 68 will store the current hour in the storage location 142*b* in the pointer 138 (block 164), store the hour record 124 (FIG. 7) in the storage location 134 of the buffer 108 (FIG. 9) pointed to by the pointer 138 and then advance (block 166) (FIG. 10B) the pointer 138 to the next available storage location 134 in the buffer 108. The microcontroller 68 will next store (block 168) the transaction record 106 (FIG. 5) in the storage location 134 of the buffer 108 pointed to by the pointer 138 and advance the pointer 138 (block 169) to the next available storage location 134 in the buffer 108, thus ending (block 170) the operation. It will be seen that if the date/hour record 116 (FIG. 6) of the previously entered employee transaction record has not changed, such redundant data will not be stored with the non-redundant transaction record 106 (FIG. 5) in the buffer 108, thus saving storage space in the buffer 108.

Figure 6:
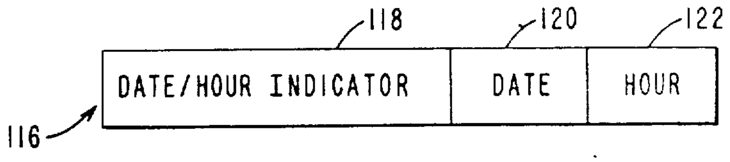
FIG. 6 is a block diagram of a date/hour record stored in the circular buffer.
Figure 7:
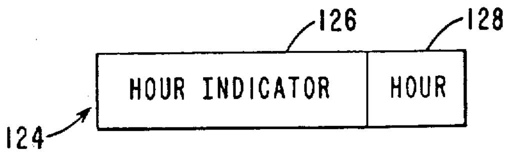
FIG. 7 is a block diagram of an hour record stored in the circular buffer.
Figure 11A:
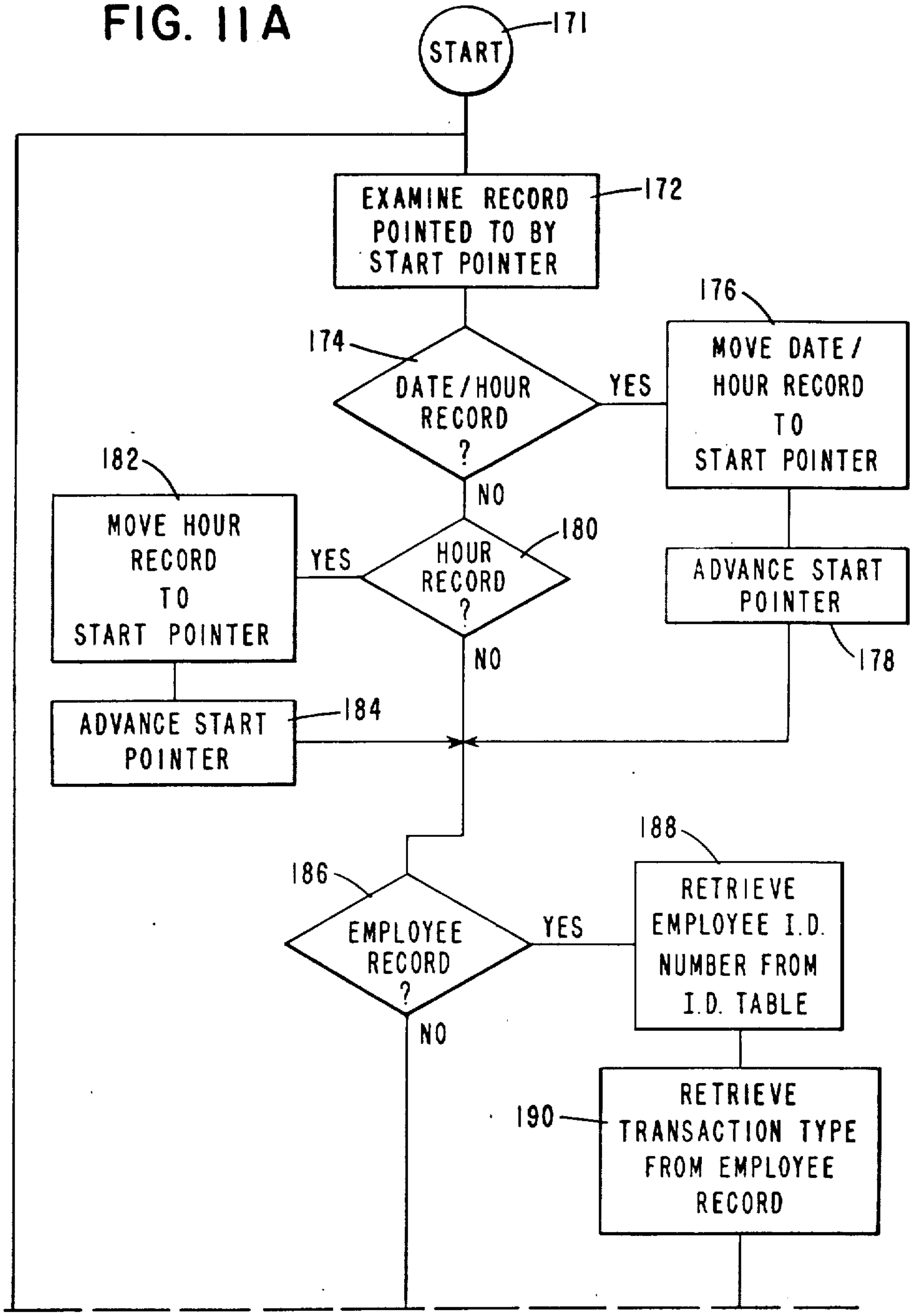
FIGS. 11A and 11B taken together form a schematic flow diagram illustrating the recovery of the compressed data stored in the circular buffer.

When the CPU 20 (FIG. 1) requests that the transaction data stored in the buffer 108 be transmitted to the processor, the microcontroller 68, at the start (block 171) (FIG. 11A) of operation, will examine the record (block 172) in the buffer 108 pointed to by the start of buffer pointer 136 (FIG. 9) and check (block 174) to see if the record is a date/hour record 116 (FIG. 6). If the record is a date/hour record, the microcontroller will move (block 176) the record to the start of buffer pointer 136 date 140*a* and hour 142*a* storage locations (FIG. 9) and then advance (block 178) the pointer 136 to the next available storage location 134 in the buffer 108. If the record pointed to by the pointer 136 is not a date/hour record 116 (FIG. 6), the microcontroller 68 will check (block 180) to determine if the record is an hour record 124 (FIG. 7). If it is an hour record that is pointed to by the pointer 136, the microcontroller 68 will move (block 182) the record to the start of buffer pointer 136 hours storage location 142*a* and advance (block 184) the pointer to the next storage location 134 in the buffer 108.

Figure 11B:
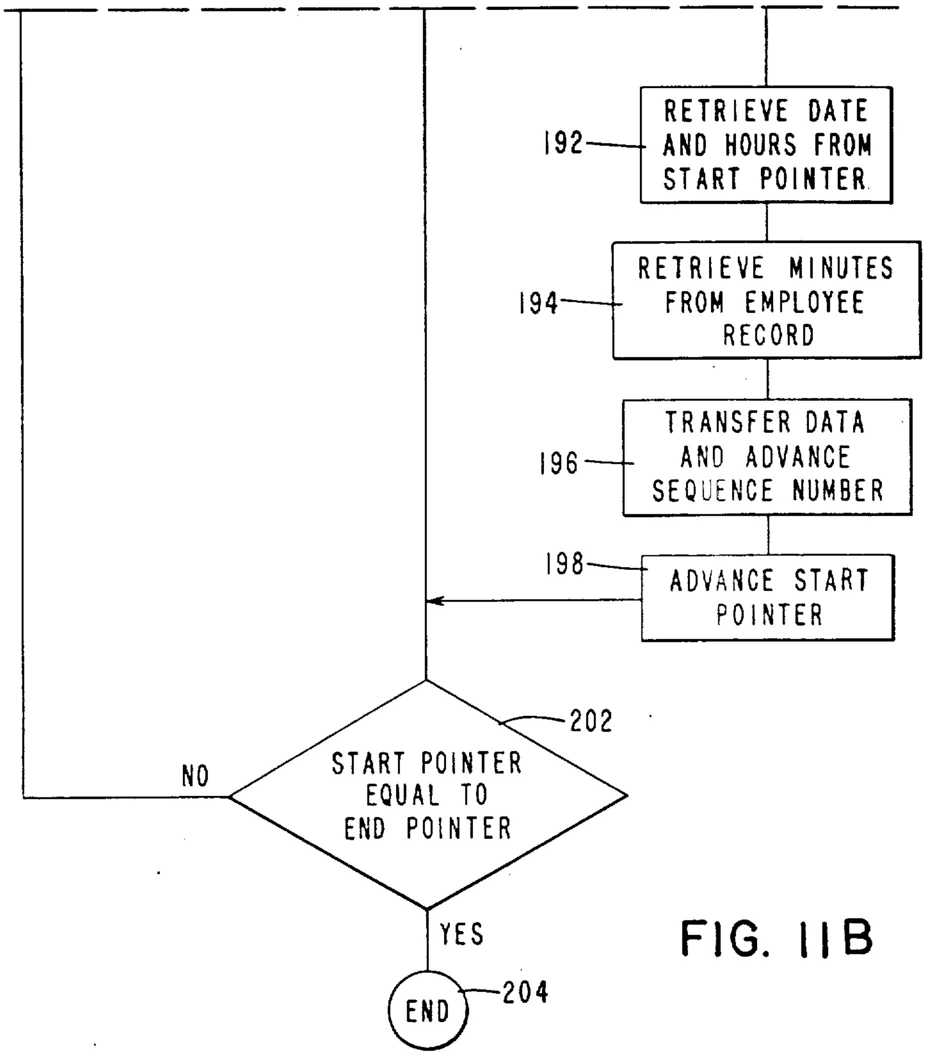

If the record being pointed to by the pointer 136 in the buffer 108 is not an hour record, the microcontroller 68 will check (block 186) to see if the record is an employee transaction record 106 (FIG. 5). If the record is an employee transaction record, the microcontroller 68, using the index field 109 found in the record 106 (FIG. 5), will retrieve (block 188) the employee I.D. number from the employee table 110 (FIG. 8). The microcontroller 68 will also retrieve the transaction data (block 190) from the transaction field 112 (FIG. 5) of the record retrieve, the data from the date 120 and hour 122 fields (FIG. 6) (block 192) (FIG. 11B) stored in the start of buffer pointer 136 date 140*a* and hour 142*a* storage locations (FIG. 9), retrieve the minutes (block 194) from the minutes field 114 of the record 106 (FIG. 5), transfer the assembled data to the CPU 20 (FIG. 1) and advance the sequence number in the storage location 200 (FIG. 9) of the pointer 136 (block 196) and advance (block 198) the pointer 136 to the next storage location 134 in the buffer 108. The microcontroller 68 will then check (block 202) to determine if the start of buffer pointer 136 is at the same position as the end of buffer pointer 138. If the pointers are not on the same location, the transfer operation is again repeated until all the data stored in the buffer 108 is transferred to the CPU 20. As part of the transfer operation, the pointer 136 will insert a sequence number from the storage slot 200 (FIG. 9) in the data message being read out of each storage location 134 of the buffer 108 (FIG. 9) for use by the CPU 20 in keeping track of the messages received from the terminal. When the start of buffer pointer 136 is at the same location as the end of buffer pointer 138, the microcontroller will terminate (block 204) the transfer operation.

It will be seen from this description that there is provided a low cost apparatus for compressing data for storage in a memory unit while still retaining the full informational content of the data, thus allowing all of the compressed data to be recovered. This construction allows more data to be stored within the capacity of an existing memory.

While the principles of the invention have now been made clear in the illustrated embodiment, it will be obvious to those skilled in the art that many modifications in structure, arrangements, elements and components can be made which are particularly adapted for specific environments and operation requirements without departing from these principals. The appended claims are therefore intended to cover and embrace any such modifications, within the limits only of the true spirit and scope of the invention.

We claim:

1. In a data processing system which includes a processor unit and a data terminal device having a keyboard operated to generate data indentifying the operator of the keyboard and the type of terminal transaction, means for outputting time of day data which includes the date, the hour and minutes, and memory means including a circular buffer for storing a plurality of data records which includes the identity of the operator, the type of terminal transaction and the time and date the keyboard is operated, a method for processing the data records comprising the steps of:

generating a first data record including a data portion identifying the keyboard operator, the type of terminal transaction and minutes and a time of day data portion comprising the hour and the date of the keyboard operation;

storing the first data record in a first location in the circular buffer;

storing the time of day portion of said first data record in a first storage area of the memory means;

generating a plurality of second data records each including a data portion identifying the keyboard operator, type of terminal transaction and minutes and a time of day data portion comprising the hour and date of the keyboard operation;

comparing the time of day data portion of each subsequently generated second data records with the time of day data portion stored in the first storage area of the memory means;

storing the data portions of each subsequently generated second data records identifying the keyboard operator, the type of terminal transaction and the minutes in consecutive locations in the circular buffer; and storing those time of day data portions of the second data records in said consecutive locations in the circular buffer when the time of day data portions are not the same as the time of day data portions stored in the first storage area of the memory means.

2. The method of claim 1 in which the step of storing the first data record further includes the step of entering the identity of the keyboard operator into the first location of the circular buffer by inserting a magnetic stripe card within the terminal device for generating data comprising an identifying number for identifying the keyboard operator.

3. The method of claim 2 which further includes the steps of;

reading each data record stored in the consecutive locations in the circular buffer;

storing the date and hour data portions of the time of day data portion of the first data record read in a second storage area of said memory means;

comparing the time of day data portions of each data record read from the circular buffer with the time of day data portion stored in said second storage area;

and adding the data stored in the second storage area of said memory means to the data of each data record subsequently read from said circular buffer for transmission to the processor unit.

4. The method of claim 3 in which said step of storing the date and hour data portions further includes the step of replacing the date and hour data portion stored in said second storage area with a new date and hour data portion found in reading a data record in the circular buffer.

5. The method of claim 4 which further includes the steps of storing in said second storage area a plurality of consecutive numbers and adding one of the consecutive numbers to the data transmitted to the processor unit as part of each data record that is read from the circular buffer and the second storage area.

* * * * *